United States Patent
Wessels et al.

(10) Patent No.: US 7,824,734 B2
(45) Date of Patent: Nov. 2, 2010

(54) METHOD OF PREPARING A SUBSTRATE HAVING A LAYER OR PATTERN OF METAL ON IT

(75) Inventors: Jurina Wessels, Stuttgart (DE); Bjoern Luessem, Stuttgart (DE); Akio Yasuda, Suginami-ku (JP); Daniel Schwaab, Wesseling (DE); Dirk Mayer, Frechen (DE); Andreas Offenhaeusser, Eynatten (BE); Sandra Gilles, Bonn (DE)

(73) Assignees: Sony Deutschland GmbH, Berlin (DE); Forschungszentrum Juelich GmbH, Juelich (DE)

( * ) Notice: Subject to any disclaimer, the term of this patent is extended or adjusted under 35 U.S.C. 154(b) by 152 days.

(21) Appl. No.: 12/036,688

(22) Filed: Feb. 25, 2008

(65) Prior Publication Data

US 2008/0241491 A1 Oct. 2, 2008

(30) Foreign Application Priority Data

Mar. 30, 2007 (EP) ................... 07006696

(51) Int. Cl.
*B05D 1/36* (2006.01)
(52) U.S. Cl. .................. 427/258; 427/256; 438/99; 438/149; 438/738; 438/151; 438/48
(58) Field of Classification Search ............. 427/258, 427/256; 438/99, 140, 738, 151, 48, 578
See application file for complete search history.

(56) References Cited

U.S. PATENT DOCUMENTS

| 6,828,581 | B2 * | 12/2004 | Zangmeister et al. ........ 257/40 |
| 2002/0136772 | A1 * | 9/2002 | Huang ........................ 424/493 |
| 2003/0175154 | A1 | 9/2003 | Hsu et al. |
| 2003/0175427 | A1 | 9/2003 | Loo et al. |
| 2008/0241491 | A1 | 10/2008 | Wessels et al. |

OTHER PUBLICATIONS

Qian Wang, et al., "Surface composition gradients of immobilized cell signaling molecules. Epidermal growth factor on gold", Thin Solid Films, XP-002452044, vol. 513, 2006, pp. 338-346.
Robert Schlapak, et al., "Glass Surfaces Grafted with High-Density Poly(ethylene glycol) as Substrates for DNA Oligonucleotide Microarrays", Langmuir, XP-002452045, vol. 22, No. 1, 2006, pp. 277-285.
U.S. Appl. No. 12/036,688, filed Feb. 25, 2008, Wessels et al.
U.S. Appl. No. 12/341,293, filed Dec. 22, 2008, Luessem et al.

* cited by examiner

*Primary Examiner*—Michael Komakov
*Assistant Examiner*—Xiao Zhao
(74) *Attorney, Agent, or Firm*—Oblon, Spivak, McClelland, Maier & Neustadt, L.L.P.

(57) ABSTRACT

A method and associated substrate is provided for applying a layer or pattern of metal on a substrate. The method includes providing a target substrate, immobilizing a layer of polymeric material on the target substrate, and applying and immobilizing a layer or pattern of metal on the layer of polymeric material on the target substrate using a stamp onto which the layer or pattern of metal has previously been applied, by bringing the stamp into conformal contact with the target substrate.

40 Claims, 11 Drawing Sheets

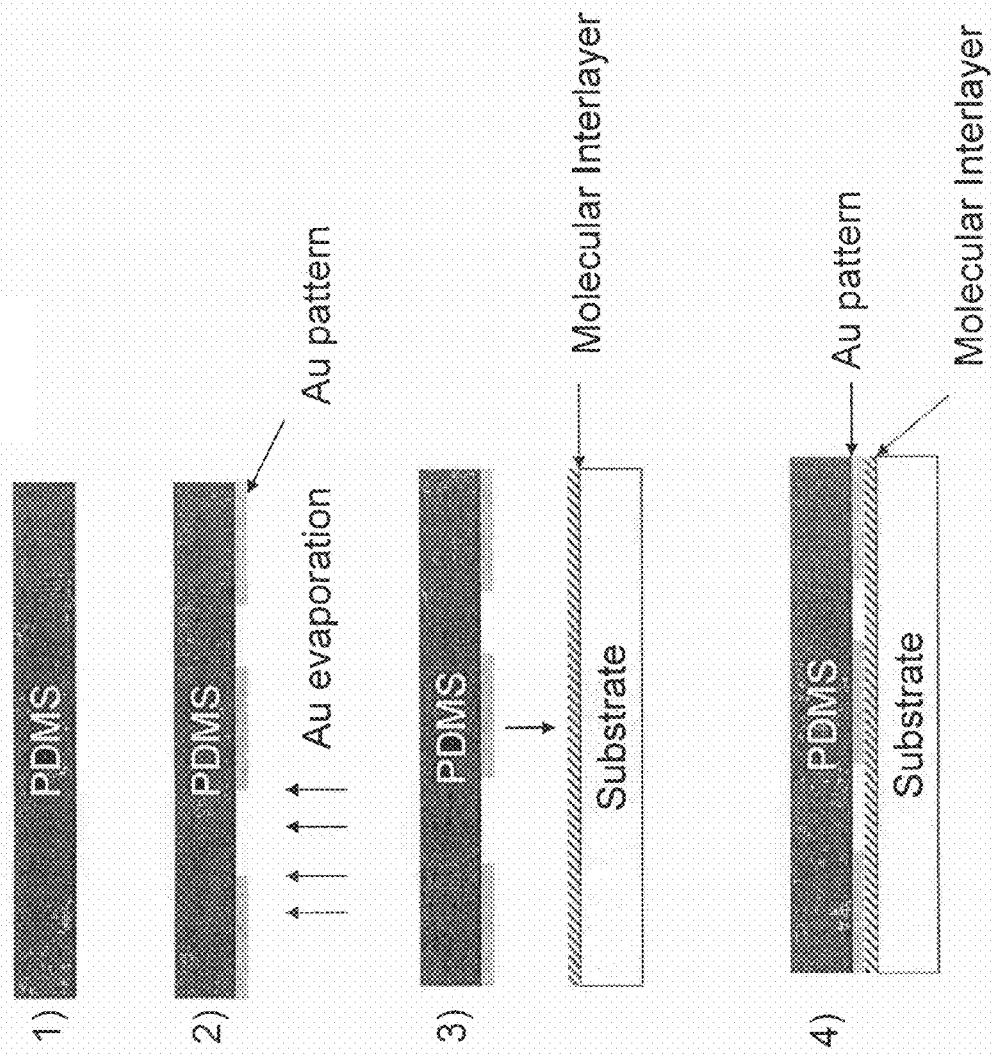

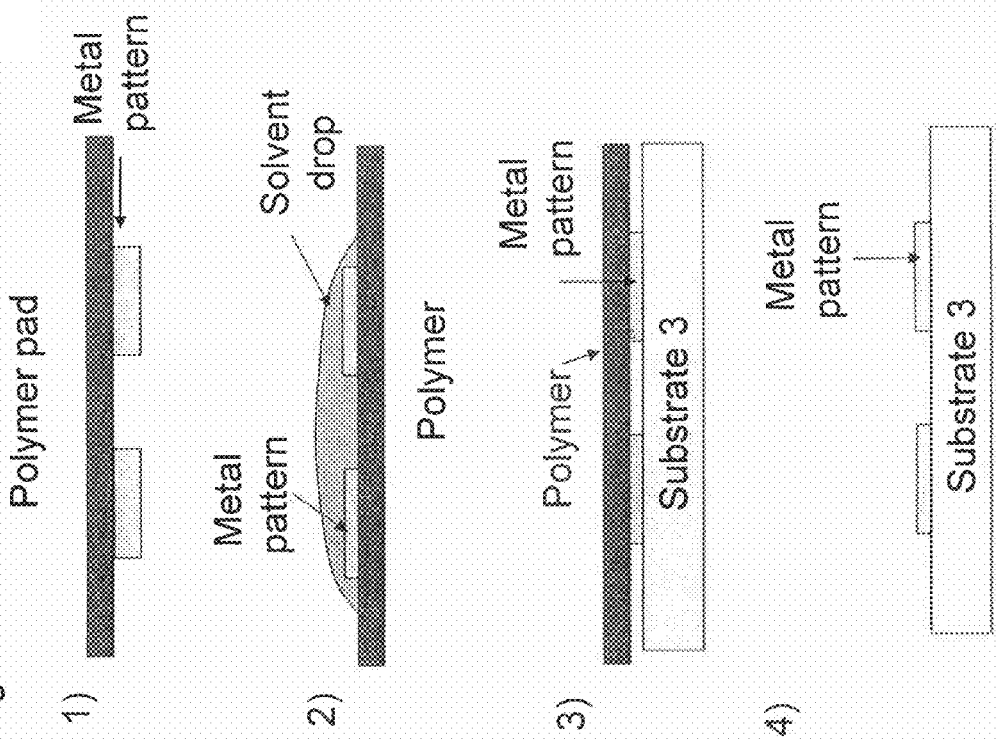

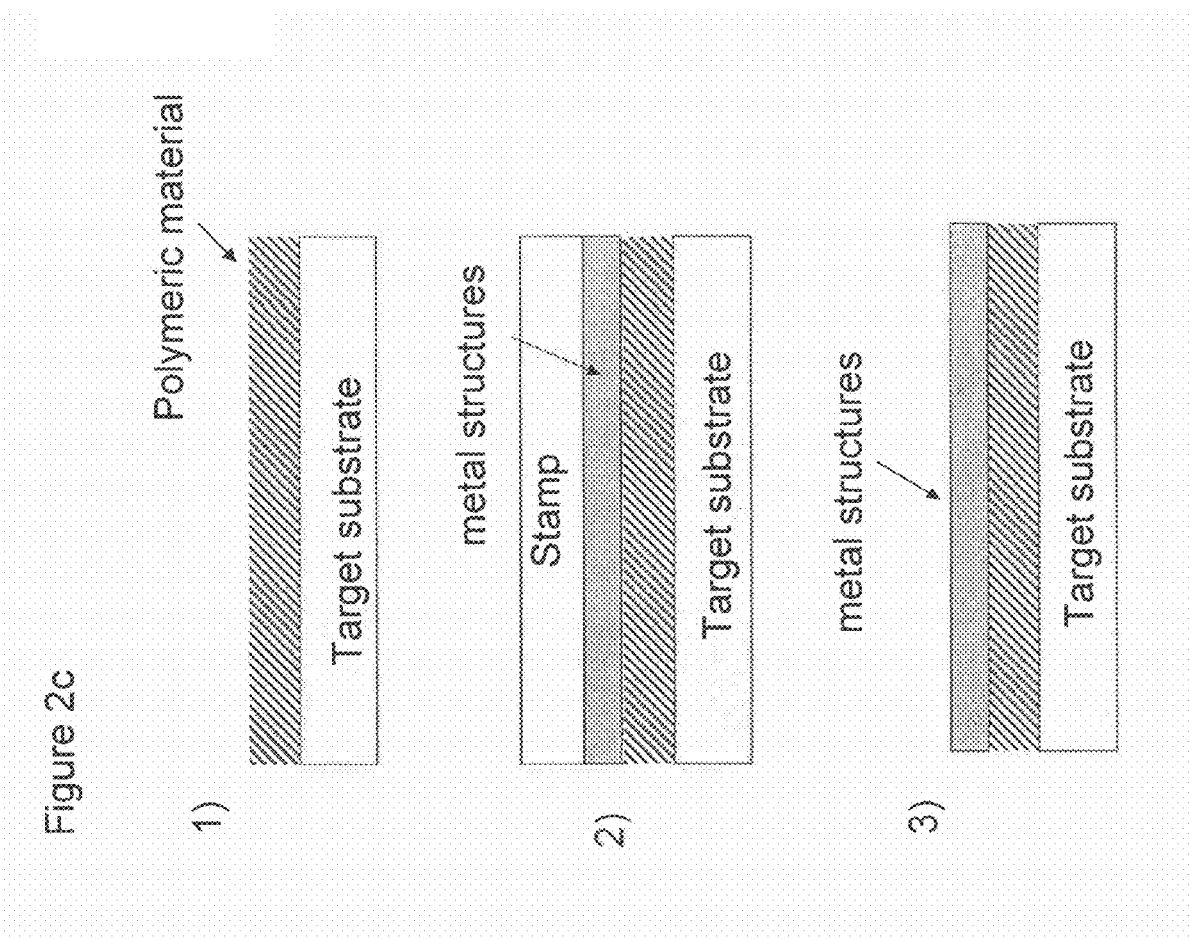

METHOD OF PREPARING A SUBSTRATE HAVING A LAYER OR PATTERN OF METAL ON IT

BACKGROUND

1. Field of the Invention

The present invention relates to a method of preparing a substrate having a layer or pattern of metal on it, to a substrate prepared by such method and to uses thereof.

2. Description of the Related Art

During the past decade, soft lithography has developed to a versatile technique for fabricating chemically micro and nano-structured surfaces. Among several techniques known collectively as soft lithography, micro contact printing (μCP) has become the most commonly used method. The technique was initially developed for the transfer of molecules and was also applied for the transfer of metals.

Two soft-lithographic methods for contacting organic materials with metals have been developed up to now, namely nano-transfer printing (nTP) and soft-contact lamination (ScL). They can be used for the parallel fabrication of multiple devices. Both methods are schematically depicted in FIG. 1.

In case of nTP in FIG. 1a, a thin layer of metal is evaporated onto a patterned elastomeric stamp, which has been fabricated by drop casting of polydimethylsiloxane (PDMS) onto a patterned Si wafer. The evaporated metal layer is brought into conformal contact with an organic layer on a substrate. As a result of the chemical bond formation at the metal-organic interface, the metal-organic adhesion is stronger than the metal-PDMS adhesion and the metal layer is transferred from the PDMS stamp onto the organic layer.

The nTP process takes place under ambient conditions without application of any additional pressure. This process has been demonstrated by the fabrication of Au top electrodes in Au/alkanedithiol/GaAs hetero junctions and Au/mercaptosilane/Si hetero junctions. In another process gold was patterned on Silicon wafers and subsequently transferred to selected polymers at high pressure (9-30 bar) and temperature between 100 and 140° C.

In case of ScL, the metal-organic adhesion is based on van der Waals interactions and is weaker than the metal-PDMS interaction. Thus, in this process, the metal is not transferred from the PDMS onto the organic layer, but the PDMS remains on the Au layer and is part of the PDMS/metal/organic/substrate hetero junction (FIG. 1b). The metal layer is prepared on top of an unstructured flat PDMS layer using shadow mask evaporation. The process takes place under ambient conditions without application of any additional pressure.

Furthermore, the present inventors have developed another process, called Shuttle Transfer Printing (STP) which is disclosed in European Patent Application No. 06006899.6, filed on Mar. 31, 2006 which can be scaled down to dimensions as low as 50-100 nm. This fabrication process is easy to perform and versatile with respect to different metals, metal oxides, and semiconductor materials.

Usually, in the aforementioned techniques, the layer or pattern of material that is transferred from one substrate to a target substrate has a certain roughness itself which roughness may interfere with the transfer and subsequent adhesion process. The roughness associated with the layer or pattern of material to be transferred, in many instances prevents a good contact between the target substrate and the pattern of material, and hence, the transfer may be inefficient or incomplete.

BRIEF SUMMARY OF THE INVENTION

Accordingly, it was an object of the present invention to provide for a method that allows the possibility to compensate for a roughness associated with a layer or pattern of material to be transferred. Moreover, it was an object of the present invention to provide for a method of preparing a substrate having a layer or pattern of metal on it, which method is easy to perform and which is versatile.

The objects of the present invention are solved by a method of applying a layer or pattern of metal on a substrate, said method comprising the steps of a) providing a target substrate, b) immobilizing a layer of polymeric material on said target substrate, c) applying and immobilizing a layer or pattern of metal on said layer of polymeric material on said target substrate using a stamp onto which said layer or pattern of metal has previously been applied, by bringing said stamp into conformal contact with said target substrate.

In one embodiment in step b) said layer of polymeric material is immobilized on said target substrate by covalently linking said polymeric material on said target substrate.

In one embodiment the adhesion between said stamp and said layer or pattern of metal is smaller than the adhesion between said layer of polymeric material and said layer or pattern of metal.

In one embodiment said layer of polymeric material comprises a polymer that has a polymer chain which is flexible, and furthermore has a proximal end and a distal end and is covalently linked to said target substrate at said proximal end and has a functional group at said distal end, said functional group allowing an immobilization of said layer or pattern of metal on said layer of polymeric material.

Preferably said layer of polymeric material has a contact angle of water in the range of from 20° and 70°, preferably from 20° to 50°, more preferably from 30° to 50°.

In one embodiment said layer of polymeric material has a Young's modulus in the range of from 0.001 GPa to 5 GPa, preferably from 0.1 GPa to 0.5 GPa.

In one embodiment said layer of polymeric material when immobilized on said target substrate has an average thickness in the range of from 1 nm to 20 μm, preferably from 1 nm to 200 nm, more preferably from 1 nm to 50 nm, and even more preferably from 1 nm to 10 nm.

In one embodiment said polymer is covalently linked to said target substrate via functional groups on the surface of said target substrate, said functional groups on the surface of said target substrate being selected from amino groups, hydroxyl groups, silanol groups, vinyl groups, carboxyl groups and thiol groups.

Preferably, said polymer is covalently linked to said target substrate via functional groups on said proximal end of said polymer, said functional groups on said proximal end of said polymer being selected from amino groups, hydroxyl groups, silanol groups, alkoxy groups, vinyl groups, carboxyl groups, thiol groups and succinimide ester groups.

In one embodiment said functional group at said distal end of said polymer is selected from a thiol group, an amino group, a hydroxyl group, a carboxyl group, a nitrile group and a carbonyl group.

In one embodiment said polymer is selected from the group comprising plastomers having a glass transition temperature lower than the temperature at which the method according to any of the foregoing claims is performed, preferably a glass transition temperature lower than 40° C., poly(ethylene glycols) (PEG), DNA, RNA, polyhydroxyalkanoates, polycarbohydrates, polypeptides and mixed self-assembled monolayers (SAMs).

Preferably, said polymer is a poly(ethylene glycol) (PEG).

More preferably, said poly(ethylene glycol) has a molecular weight in the range of from 500 Da to 10000 Da, preferably from 1000 Da to 5000 Da, more preferably from 2000 Da to 4000 Da and most preferably approximately 3000 Da.

Even more preferably, said poly(ethylene glycol) comprises approximately 50-100 ethylene glycol units, preferably 50-80 ethylene glycol units, more preferably 60-70 ethylene glycol units.

In one embodiment said target substrate is made of a material selected from Si, Si having a $SiO_2$ layer on top of it, mica, glass, float glass, perovskites, quartz, amorphous composites, metal, metal oxide and a semiconductor, said metal being selected from the group comprising Au, Ti, Pt, Ag, Cr, Cu, Al, and alloys thereof, said metal oxide being selected from the group comprising $Al_2O_3$, AgO, $TiO_2$, $SiO_2$, $DyScO_3$, YsZ, and said semiconductor is preferably selected from the group comprising Si, Ge, GaAs, GaN, In, Sb, InP, CdS, ZnSe.

In one embodiment said target substrate, prior to performing step b), comprises a structure of metal of defined dimensions, such as height, target substrate area covered by said structure, length and shape, wherein, preferably, said structure of metal is at least partially integrated into a surface of said target substrate.

In one embodiment said polymer has a length equal to the height of said structure of metal above the surface of said target substrate, or said polymer has a length which is $\leq 40\%$ longer, preferably $\leq 20\%$ longer, more preferably $\leq 10\%$ longer, than the height of said structure of metal above the surface of said target substrate.

In one embodiment said structure of metal is covered by a layer of molecules, wherein, preferably, said polymer has a length equal to the height of said structure of metal, including said layer of molecules.

In one embodiment said poly(ethylene glycol) has a succinimide ester group on said proximal end and is covalently linked to said target substrate via amino groups on the surface of said target substrate which amino groups are linked with said succinimide ester group on said proximal end of said poly(ethylene glycol).

Preferably, said poly(ethylene glycol) has a thiol group on said distal end.

In one embodiment, up to and including step b), said functional group at said distal end of said polymer, preferably said thiol group, is protected by a protecting group, preferably by a trityl group, wherein, preferably, after step b) and prior to step c), said functional group at said distal end of said polymer, preferably said thiol group, is deprotected.

In one embodiment in step c) said layer or pattern of metal which has previously been applied onto said stamp, is transferred onto said layer of polymeric material on said target substrate upon bringing said stamp into conformal contact with said target substrate.

In one embodiment said metal in said layer or pattern of metal is selected from the group comprising Au, Ti, Pt, Ag, Cr, Cu, Al and alloys thereof, and said metal in said structure of metal as defined in any of claims 16-20 is independently selected from the group comprising Au, Ti, Pt, Ag, Cr, Cu, Al and alloys thereof.

In one embodiment said stamp onto which a layer or pattern of metal has previously been applied is a polymeric stamp, wherein, preferably, said polymeric stamp is made of a polymeric material selected from the group comprising elastomers, plastomers, ionomers and resins.

The objects of the present invention are also solved by a substrate having a layer or pattern of metal on it and being prepared by the method according to the present invention.

The objects of the present invention are also solved by a use of a substrate according to the present invention in an electronic device.

BRIEF DESCRIPTION OF THE DRAWINGS

A more complete appreciation of the invention and many attendant advantages thereof will be readily obtained as the same becomes better understood by reference to the following detailed description when considered in connection with the accompanying drawings, wherein.

DETAILED DESCRIPTION

In this application reference is made to a "target substrate". By this term, a substrate is meant which is intended to be the destination of a layer or pattern of metal in accordance with the present invention. This "target substrate" can be either flat and unstructured or structured by a bottom electrode. In some embodiments, this "target substrate" may already, prior to performing the method according to the present invention, have a structure of metal integrated. Such structure of metal may be partially buried in a surface of said target substrate, or it may sit on top of said "target substrate". Such structure of metal may be used as an electrode, for example if such substrate is to be used in an electronic device.

Figure 1A:
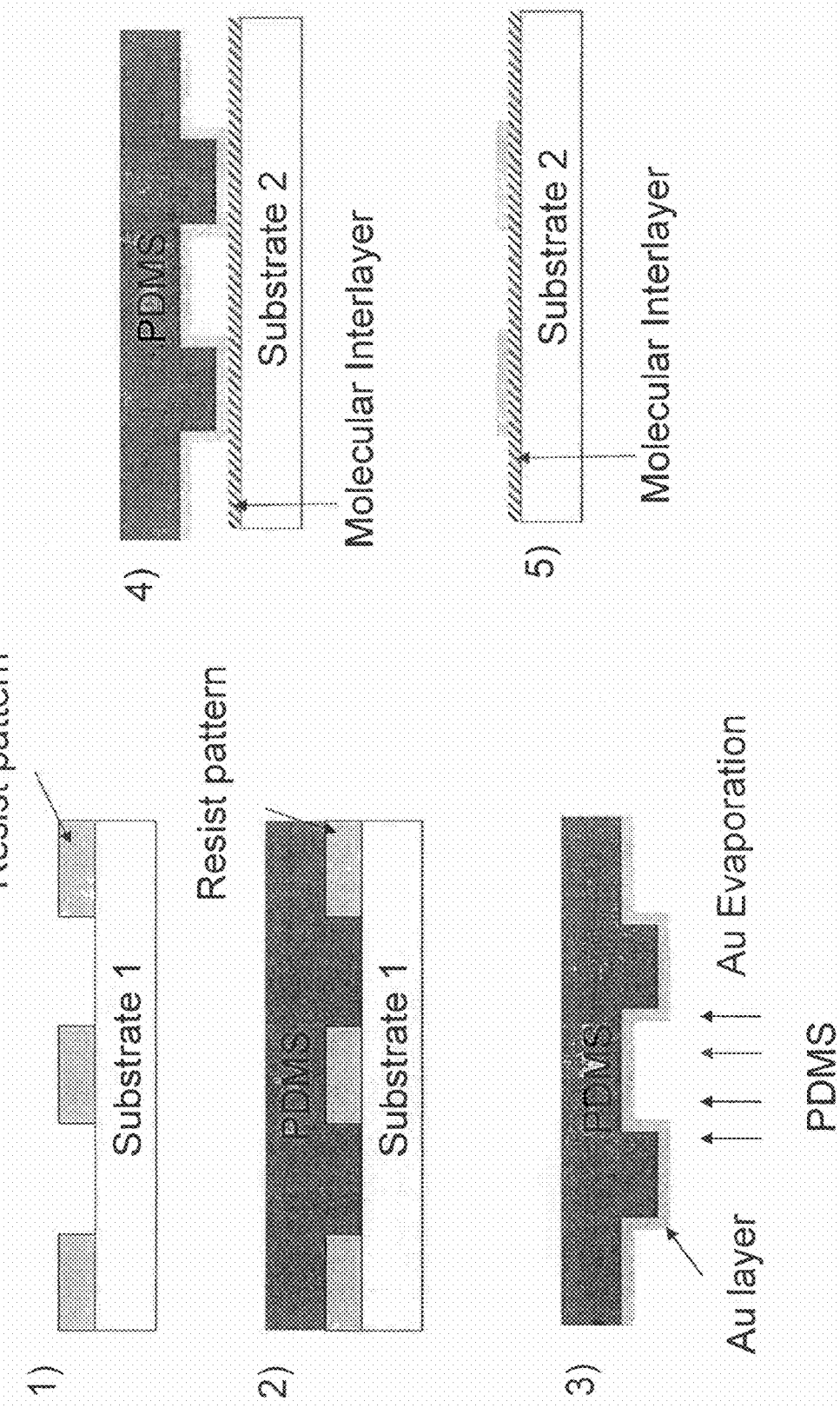
FIG. 1 illustrates a schematic representation of the nano-transfer printing process (nTP) and the soft-contact lamination process (ScL)
Figure 2A:
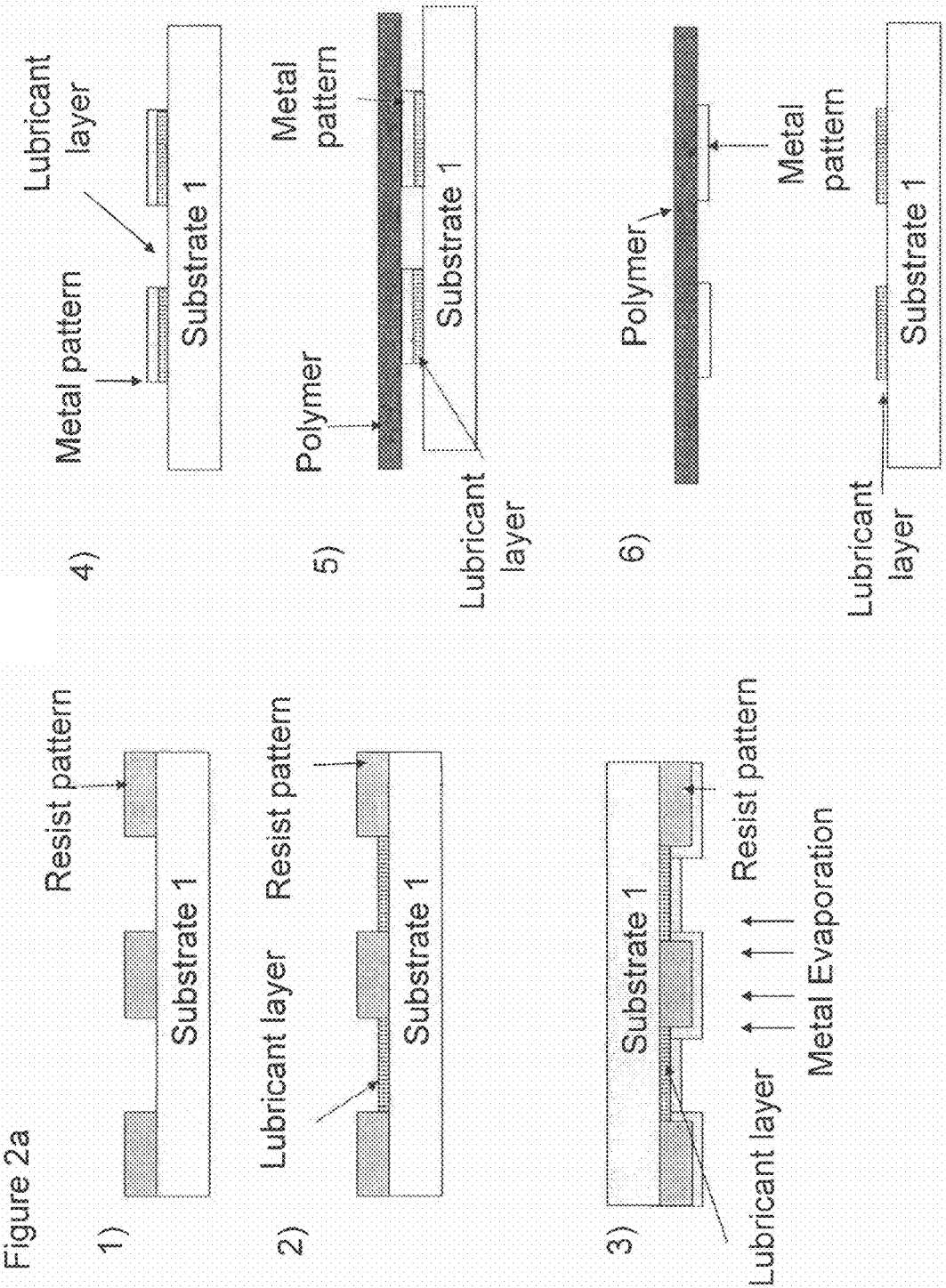
FIG. 2 illustrates a schematic representation of the transfer of patterned metal structures onto polymer stamps, and the transfer of metal patterns from polymer stamps onto other surfaces such as a $SiO_2$.

In this application, the target substrate is also referred to as "substrate 2" (see FIGS. 1a and 3) or as a "substrate 3" (see FIG. 2b). In contrast thereto, in this application reference is also made to "substrate 1" (see for example FIG. 1a, FIG. 2a and FIG. 3). This term is meant to refer to any substrate on which in a first step, a pattern of metal is created which is then subsequently transferred therefrom via a stamp to the "target substrate". In any of these scenarios it should be observed that the adhesion between the target substrate and the layer or pattern of metal should be higher than the adhesion between the stamp (which is preferably a polymeric stamp) and the layer or pattern of metal.

Figure 3:
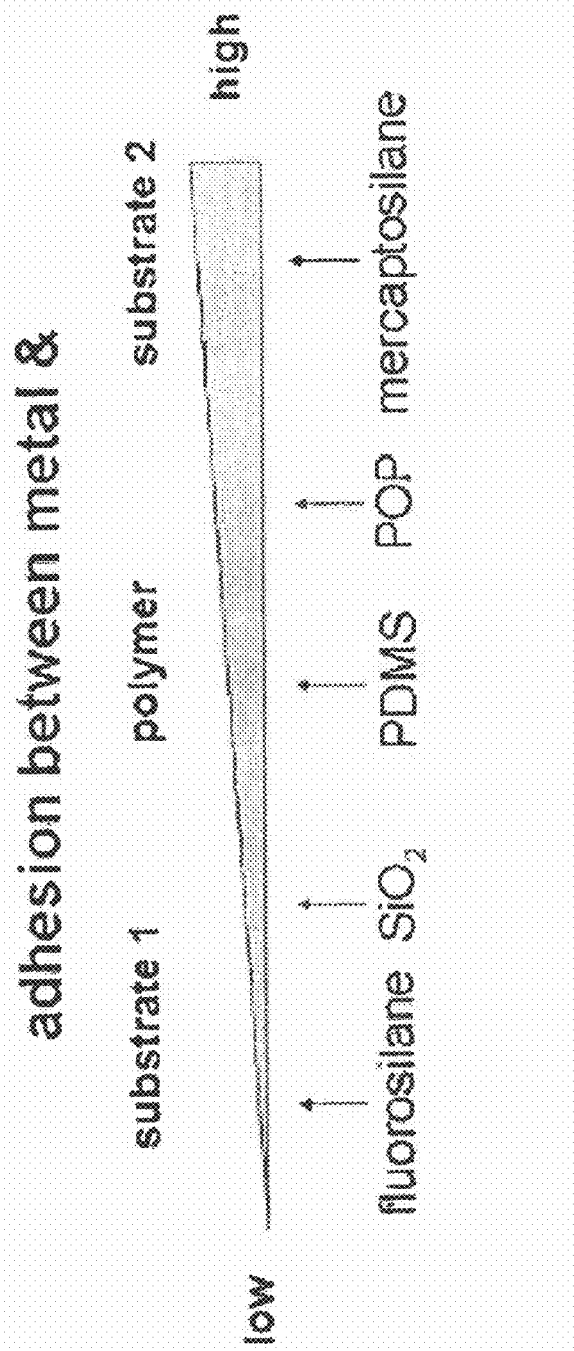
FIG. 3 illustrates a chart displaying the different adhesion strengths that are required for an efficient transfer of the Au material from a first substrate onto a polymer stamp and subsequently onto a target substrate.

Likewise, the adhesion between the stamp and the layer or pattern of metal should be higher than the adhesion between the layer or pattern of metal and the original substrate, i.e. substrate 1. FIG. 3 shows a schematic overview in this respect making it clear that the adhesion between the layer or pattern of metal and the target substrate should be the biggest of all adhesions so as to allow a transfer of the layer or pattern of metal onto the target substrate. (abbreviations in FIG. 3: PDMS=polydimethylsiloxane; POP=polyolefinic polymer.)

Likewise, in the present application reference is made to a "stamp". By this term, any entity, such as a substrate is meant which has a surface that allows the transfer of a layer or pattern of metal by temporarily acting as a shuttle. Such "shuttle substrate" serves the purpose of transferring a layer or pattern of metal onto a target substrate. Ways to prepare a stamp onto which a layer or pattern of metal has previously been applied are numerous and are for example disclosed in European Patent Application No. 06006899.6 which is incorporated herein in its entirety by reference thereto. In this European Patent Application, more specifically, different processes are disclosed that allow the transfer of a metal layer onto a polymer pad or polymer stamp. All of these can be used to prepare a stamp having a pattern of metal on top.

Process 1 (see FIG. 2a):

The process steps involve the preparation of a resist pattern on a flat substrate surface (1). Subsequently, a lubricant layer is deposited onto the substrate (2) before evaporation/deposition of a metal layer (3) and the lift-off step (4). Such lift-off step in this process and in the other embodiments of the present invention is performed by dissolving the resist pattern in an appropriate solvent. This process leads to a structured metal layer, which is separated from the substrate by a lubricant layer. The metal layer is brought into conformal contact with a transfer pad (5) or stamp, which is typically made from a polymer. If the adhesion forces of the metal layer on the lubricant layer are weaker than the interaction between the metal layer and the polymer, the metal layer is transferred onto the polymer (6) of said stamp.

Process 2 (see FIG. 2b):

The process steps involve the preparation of a metal layer e.g. Au, onto a polymer pad according to Process 1 (1). A polar solvent is dropped onto the metal layer (2). The solvent is dragged between the metal layer, e.g. Au layer and the polymer thereby weakening the adhesion forces. The metal layer is brought into conformal contact with a target substrate (3) ("substrate 3") and, due to the weakening of the adhesion forces by the polar solvent, the metal pattern is transferred from the polymer pad onto the target substrate (4).

Reference is made in the present application to bringing a substrate or stamp "into conformal contact with" a target substrate. By this term any contact between the stamp and the target substrate is meant that allows the transfer of a layer or pattern of metal material from the stamp to the target substrate. In some embodiments, exertion of pressure is needed for such transfer to occur, and in these instances, the term "to bring into conformal contact with" is to be equated "to press on(to)".

Although, in preferred embodiments, the interaction between said layer of metal and the target substrate is by covalent linkage, other scenarios may be envisioned and are encompassed by the present invention wherein the interaction is by van der Waals-interactions or via electrostatic interactions.

A "contact angle of water", as used herein, is meant to refer to the angle at the three phase contact line for water/air/dry surface. Ways in which the contact angle of water is measured are known to a person skilled in the art. Examples of devices that may be used for measuring such contact angle are the "OCA20"-system available from DataPhysics Instruments GmbH, Filderstadt, Germany or the "CAM 100 Optical Contact Angle Meter" available from KSV Instruments Ltd., Helsinki, Finland.

The "Young's modulus" is a measure of the tensile strength of a material and is defined as the ratio of tensile stress to tensile strain. It is often also referred to simply as "elastic modulus". The Young's modulus is commonly derived from the slope of a stress-strain curve, preferably in the region of small strains.

Reference is made to a "polymer chain which is flexible". This term, as used herein, is meant to refer to a mobility in the polymer which is characterized by a free rotation about the bonds in the polymer chain.

The present inventors have devised a process which is versatile and allows compensating for the roughness that is associated with metal layers or metal patterns to be transferred. The process is easy to perform and can be applied to many surfaces using an additional layer on the target substrate which may also be referred to as a "roughness compensating adhesion layer" or a "roughness matching adhesion layer". In preferred embodiments, such "roughness compensating adhesion layer" is made from a polymeric material which comprises a polymer that, has a chemical functionality attached to the distal end allowing the attachment of metal, is flexible and compressible to compensate metal surface roughness, has a suitable length to bury metal structures, is strongly anchored to target substrate, preferably by covalent linkage between a functional group at the proximal end of the polymer and a functional group on the surface of the target substrate, and is chemically stable.

Without wishing to be bound by any theory, the present inventors believe that such compressibility is due to the polymeric nature of the "roughness compensating adhesion layer".

Ways to attach a layer of polymeric material are numerous and are known to a person skilled in the art. For example, polymeric layers can be deposited by spin coating, by chemical binding polymeric end groups to a surface (e.g. thiol endgroups to bind the polymer onto gold or silanes to bind polymers onto silicon oxide) or by chemical binding via amino groups immobilized on the substrate surface by silanization.

Different embodiments of the process according to the present invention may be described which illustrate the use of the "roughness matching adhesion layer":

Process 3 (see FIG. 2c)

The process steps involve the immobilization of a polymeric material on an uncovered substrate (1). Metal structures, e.g. electrode structures, which have been transferred onto a stamp using process 1, are brought in contact with the modified substrate (2). Due to the compressibility of the polymeric material, the metal structures are in conformal contact to the modified substrate. Any roughness of the metal structures can be compensated by mechanical deformation of the polymeric layer.

If the adhesion forces between the polymeric layer and the metal structures, e.g. electrode structures, are stronger than the interaction between the metal structures and the stamp, the metal structures will be transferred onto the modified substrate (3).

Figure 2D:
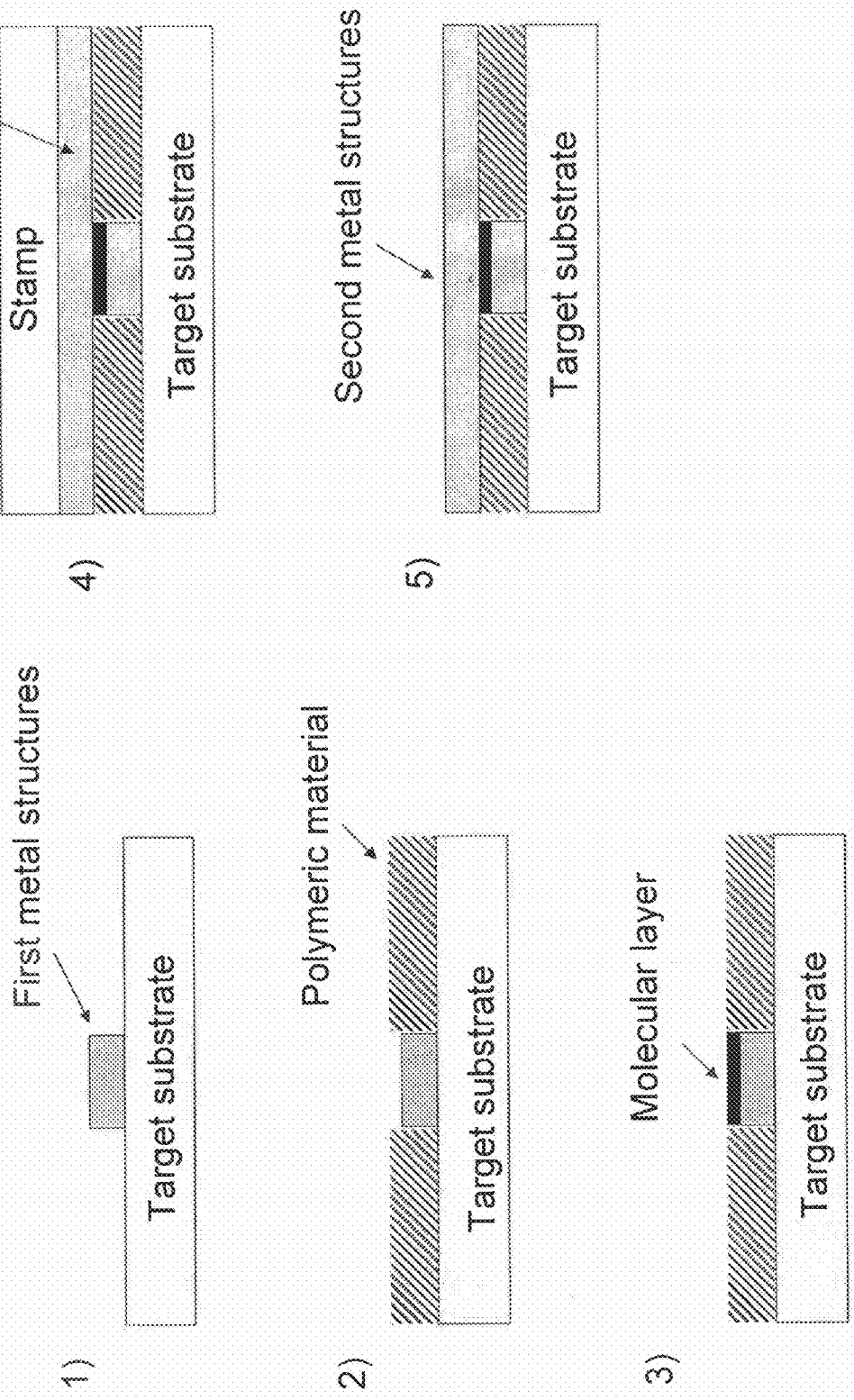

Process 4 (see FIG. 2d)

The process steps involve the preparation of first metal structures on a flat target substrate, e.g. by a standard process, such as using a resist pattern, subsequent application of metal and removal of the resist. Subsequently, a polymeric material is immobilized on the uncovered substrate (2). The thickness of the polymeric layer is adapted to the height of the metal structures, so that the metal structures are buried in the polymeric layer. Such first metal structures may e.g. be electrodes. A molecular layer is deposited onto the electrodes (3). The molecular layer may be used to adjust the height of the first metal structures. Additional metal structures, e.g. electrode structures, which have preferably been prepared on a stamp using process 1, are brought in contact with the modified substrate. Due to the buried electrodes, the second electrode structures are in conformal contact with the modified substrate. Any roughness of the electrode structures can be compensated by mechanical deformation of the polymeric layer.

If the adhesion forces of the polymeric layer on the second electrode structures are stronger than the interaction between the second electrode structures and the stamp, the second electrode structures are transferred onto the modified substrate (5).

The reproducible and efficient transfer of a pattern or layer of metal to the target substrate may be tested with the Scotch tape test. This is a common method for testing qualitatively the adhesion of a thin film to a substrate. If a Scotch tape is applied to the target substrate onto which the layer or pattern of metal has already been transferred and subsequently, the Scotch tape is stripped of, this will result in removal of the weekly bonded material, whereas films efficiently and firmly transferred onto the target substrate will stay on the surface of the target substrate.

In all instances and experiments performed by the inventors, the substrate prepared in accordance with the method according to the present invention survived the Scotch tape test in an excellent manner as can be seen e.g. from FIG. 8.

Figure 4:
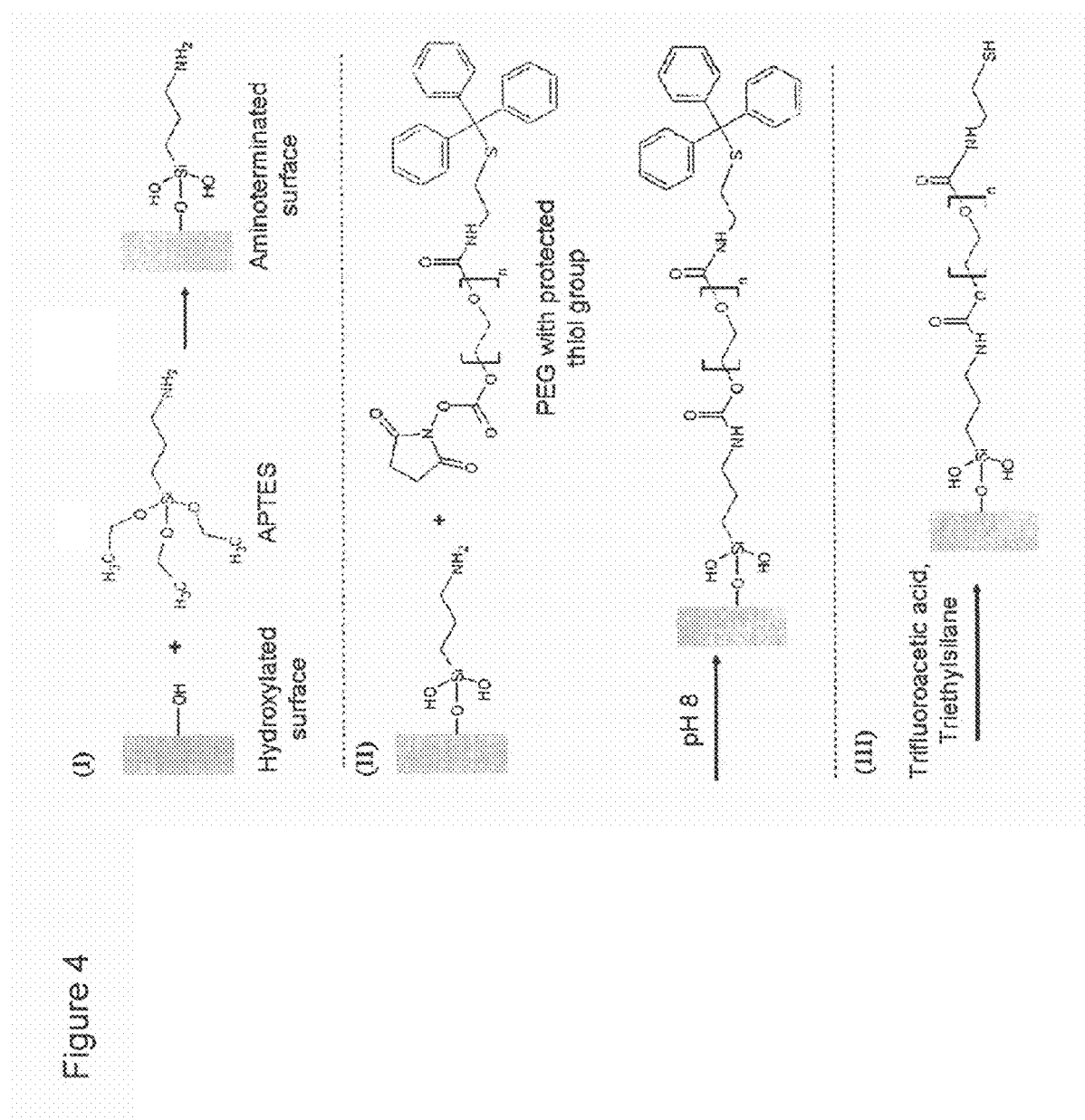
FIG. 4 illustrates a flow chart of the reaction steps of one embodiment of the method according to the present invention.
Figure 5:
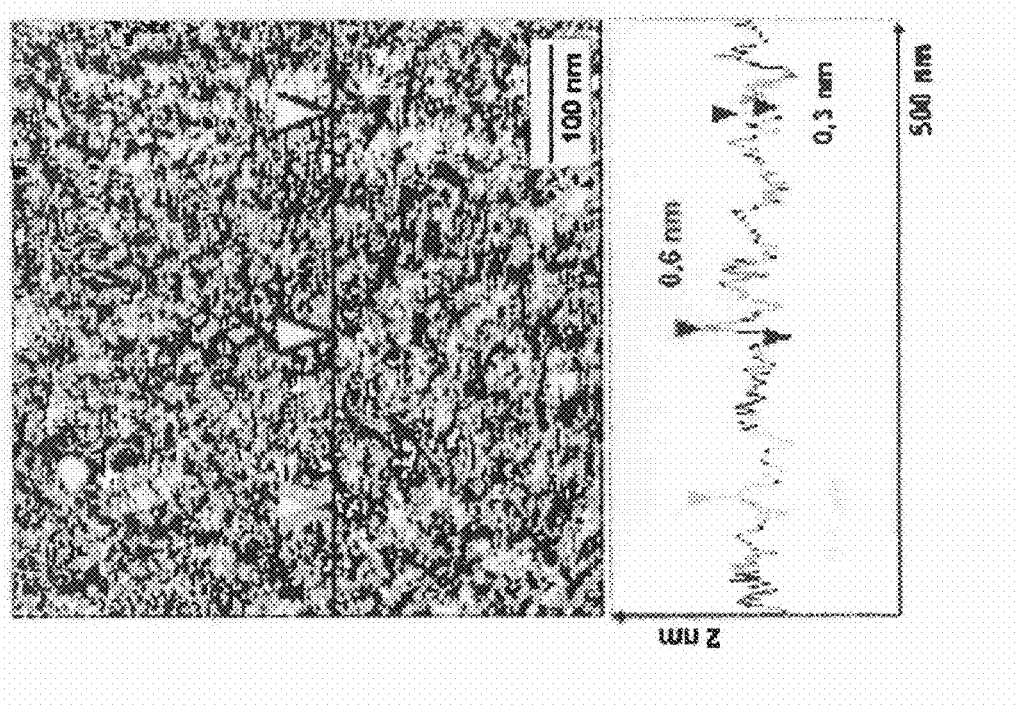
FIG. 5 illustrates an atomic force microscope image of the aminosilane layer prior to the immobilization of the poly (ethylene glycol), with a roughness profile underneath.

In an exemplary manner according to FIG. 4, a silicon wafer having a $SiO_2$ surface was used as target substrate, as a roughness matching layer poly(ethyleneglycol) (PEG) was introduced. Without wishing to be bound by any theory, the inventors believe that PEG provides a deformable zone. One end (the "proximal end") was a succinimide ester, that could be coupled to an aminoterminated surface. The other end (the "distal end") had a sulfur atom protected by a trityl group ("Trt") to avoid unwanted reaction of the thiol group. In this case ($\alpha$-Tritylthio-$\omega$-carboxy succinimidyl ester poly(ethylene glycol)) (Su-COO—PEG-CO—NH—$C_2H_4$—S-Trt) with a molecular weight of 3000 Da was used. This corresponds to 60-70 PEG units. The length of a molecule is about 20-30 nm.

In order to bind Su-COO—PEG-CO—NH—$C_2H_4$—S-Trt onto the surface, amino groups were introduced on the surface of the silicon wafer by silanizing the $SiO_2$ surface with 3-Aminopropyltriethoxysilane. Subsequently to the binding of the Su-COO—PEG-CO—NH—C2H4-S-Trt to the surface, the trityl protection group was cleaved in pure trifluoroacetic acid with triethylsilane as scavenger. The reaction steps are shown in FIG. 4.

Process (see also FIGS. 2c, 4, 5 and 7):

The process steps involve the preparation of a amino functionalized $SiO_2$ (1) surface using 3-aminopropyltriethoxysilane. The silanization process was performed in a desiccator inside the glovebox for 1 hour at a pressure of 5 mbar. The aminosilane layer has a surface roughness after the silanization is 0.20 nm for a 4 $\mu m^2$ area (FIG. 5) and a contact angle of about 48°. In a second step Su-COO—PEG-CO—NH—$C_2H_4$-S-Trt, containing about 60-70 PEG units is coupled to the surface. The amino modified substrate was immersed for 2.5 h into a phosphate buffer solution (pH 8) containing 1 mM of Su-COO—PEG-CO—NH—$C_2H_4$—S-Trt.

Figure 6:
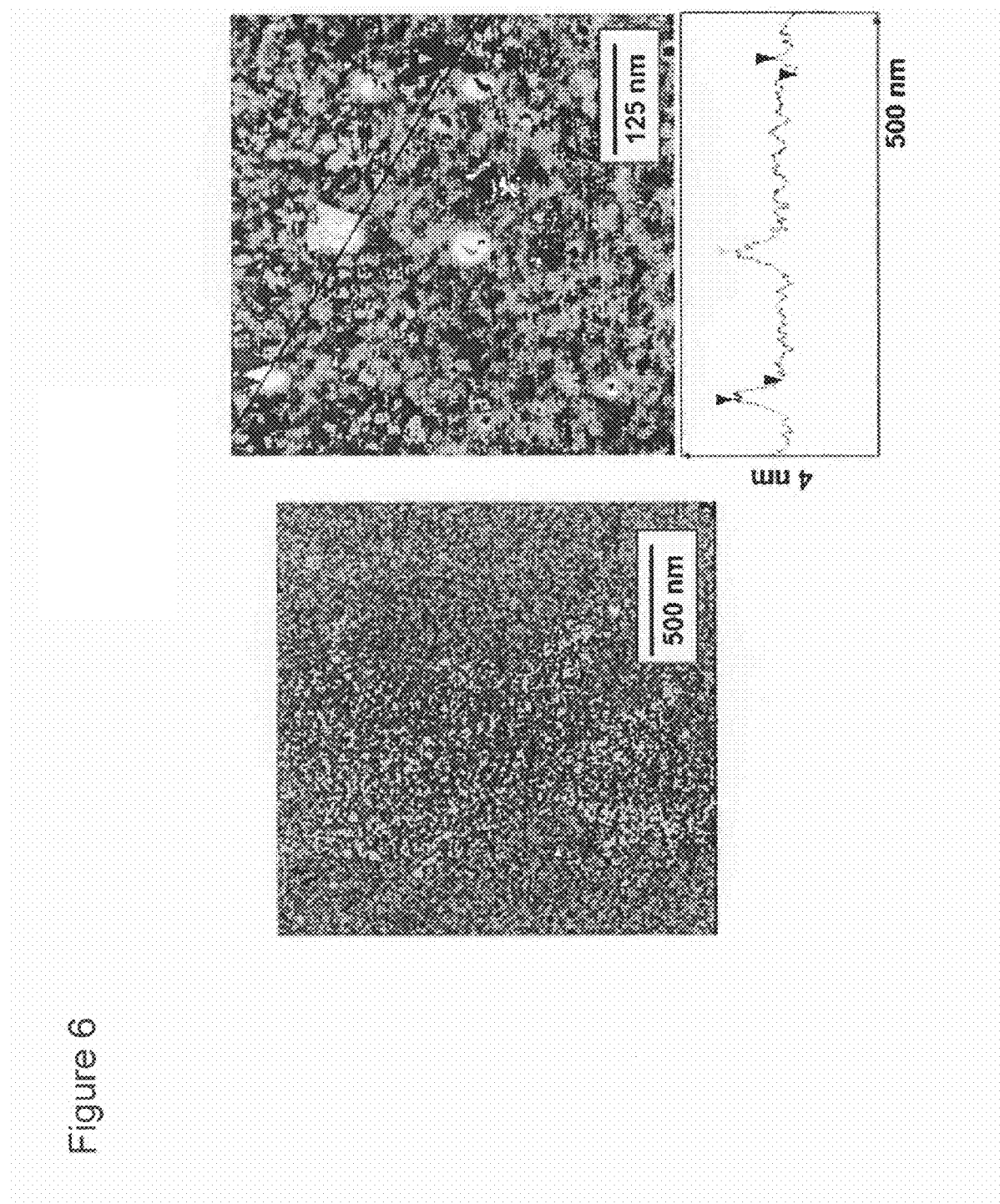
FIG. 6 illustrates two atomic force microscope images of a PEG-modified target substrate, at two different magnifications, with a roughness profile underneath.

Subsequently the substrates were rinsed with water and dried under a stream of argon. The resulting substrate (2) had a layer thickness of 2.6 nm. This is about 10% of the theoretical length, indicating that the PEG is not densely packed on the surface. Subsequently the trityl group was cleaved by immersing the substrate into pure trifluoroacetic acid containing a few drops of triethylsilane. The layer thickness of the final substrate (3) was 1.9 nm and the layer had a contact angle of 36°. This value is in the range of MPTES (3-Mercaptopropyltriethoxysilane) modified surfaces (contact angle of 34-40°). The surface has a rms value of 0.18 nm on 4 $\mu m^2$ area (FIG. 6).

Figure 7:
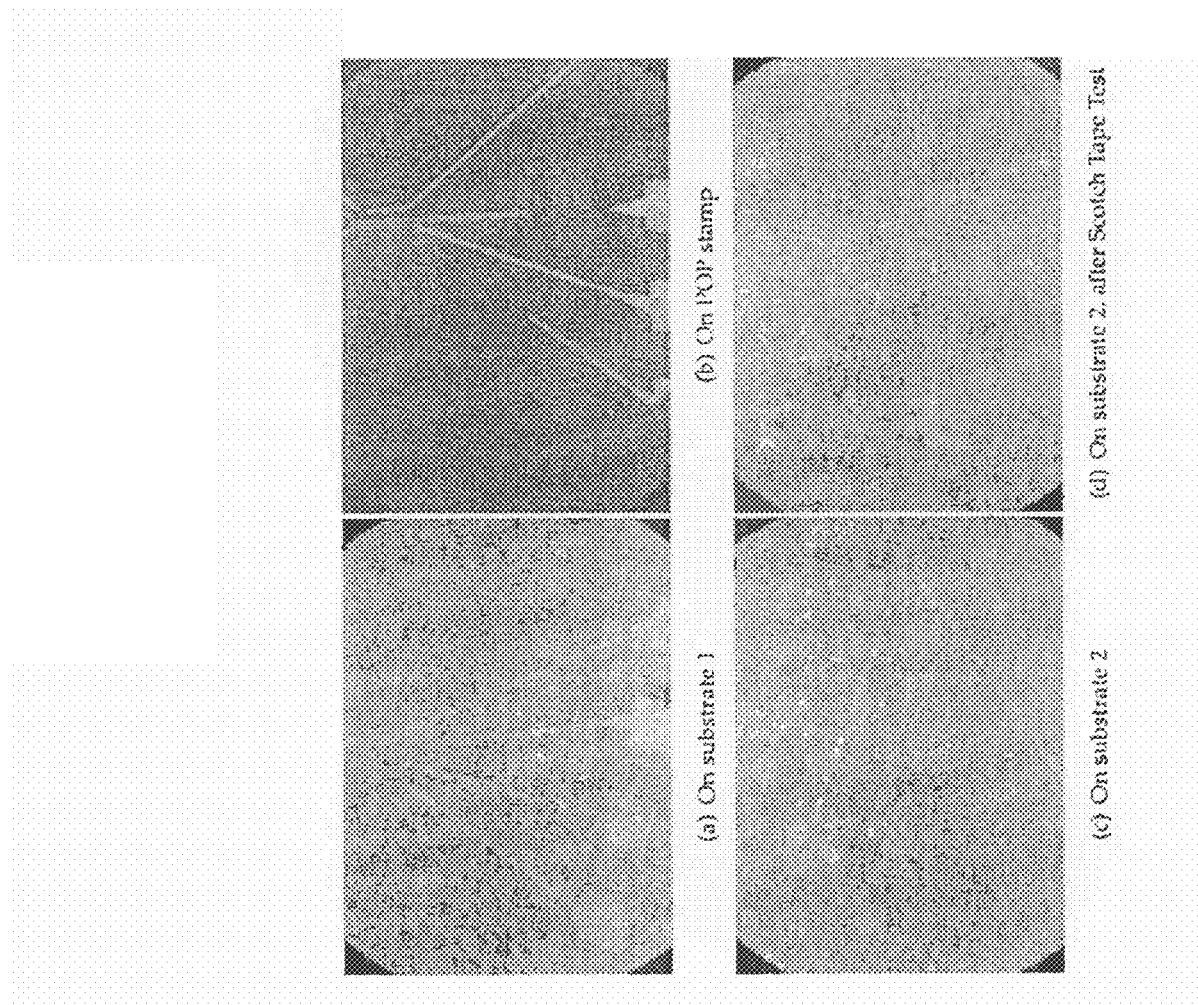
FIG. 7 illustrates images of structured Au that was transferred from a $SiO_2$ wafer onto a polymer substrate (stamp) and subsequently to a target substrate that had been modified in accordance with the present invention.

FIG. 7 shows optical images of structured Au that was transferred from a $SiO_2$ (a) wafer onto a polymer substrate (b) and from the polymer substrate onto the chemically functionalized $SiO_2$ target substrate before (c) and after (d) the Scotch tape test.

As shown in FIG. 7, this process is versatile and allows the functionalization of surfaces that have patterned metal structures on the surface.

The features of the present invention disclosed in the specification, the claims and/or in the accompanying drawings, may, both separately, and in any combination thereof, be material for realizing the invention in various forms thereof.

REFERENCE LIST

[1.] Y. N. Xia, G. M. Whitesides, *Annual Review of Materials Science* 1998, 28 153-184.

[2.] B. Michel, A. Bernard, A. Bietsch, E. Delamarche, M. Geissler, D. Juncker, H. Kind, J. P. Renault, H. Rothuizen, H. Schmid, P. Schmidt-Winkel, R. Stutz, H. Wolf, *Ibm Journal of Research and Development* 2001, 45 697-719.

[3.] J. W. P. Hsu, *Materials Today* July/August 2005, 42-54.

[4.] Y. L. Loo, R. L. Willett, K. W. Baldwin, J. A. Rogers, *Applied Physics Letters* 2002, 81 562-564.

[5.] Loo, Y. L., Rogers, and J. A. U.S. Pat. No. 6,946,332 B2. 20-9-2005. Ref Type: Patent

[6.] Y. L. Loo, T. Someya, K. W. Baldwin, Z. N. Bao, P. Ho, A. Dodabalapur, H. E. Katz, J. A. Rogers, *Proceedings of the National Academy of Sciences of the United States of America* 2002, 99 10252-10256.

[7.] Y. L. Loo, J. W. P. Hsu, R. L. Willett, K. W. Baldwin, K. W. West, J. A. Rogers, *Journal of Vacuum Science & Technology B* 2002, 20 2853-2856.

[8.] Y. L. Loo, R. L. Willett, K. W. Baldwin, J. A. Rogers, *Journal of the American Chemical Society* 2002, 124 7654-7655.

[9.] D. R. Hines, S. Mezhenny, M. Breban, E. D. Williams, V. W. Ballarotto, G. Esen, A. Southard, M. S. Fuhrer, *Applied Physics Letters* 2005, 86 163101.

[10.] D. A. Bernards, T. Biegala, Z. A. Samuels, J. D. Slinker, G. G. Malliaras, S. Flores-Torres, H. D. Abruna, J. A. Rogers, *Applied Physics Letters* 2004, 84 3675-3677.

[11.] Schwaab, D., RWTH Aachen, 2007.

[12.] J. B. Schlenoff, J. R. Dharia, H. Xu, L. Q. Wen, M. Li, *Macromolecules* 1995, 28 4290-4295.

[13.] J. Rundqvist, J. H. Hoh, D. B. Haviland, *Journal of Colloid and Interface Science* 2006, 301 337-341.

[14.] Stouffer J M, McCarthy T. J., *Macromolecules* 1988, 21 1204-1208.

[15.] Y. Han, A. Offenhausser, S. Ingebrandt, *Surface and Interface Analysis* 2006, 38 176-181.

[16.] M. Scholl, C. Sprossler, M. Denyer, M. Krause, K. Nakajima, A. Maelicke, W. Knoll, A. Offenhausser, *Journal of Neuroscience Methods* 2000, 104 65-75.

[17.] P. J. Kocienski, *Protecting Groups*, Thieme, 2005.

[18.] D. A. Pearson, M. Blanchette, M. L. Baker, C. A. Guidon, *Tetrahedron Letters* 1989, 30 2739.

The invention claimed is:

1. A method of applying a layer or pattern of metal on a substrate, the method comprising:
   providing a target substrate,
   immobilizing a layer of polymeric material on the target substrate,
   applying and immobilizing a layer or pattern of metal on the layer of polymeric material on the target substrate using a stamp onto which the layer or pattern of metal has previously been applied, by bringing the stamp into conformal contact with the target substrate,
   wherein the layer of polymeric material includes a polymer that has a flexible polymer chain including a poly(ethylene glycol) (PEG) having approximately 60-70 ethylene glycol units, the polymer including a proximal end and a distal end having a functional group,
   wherein the layer of polymeric material is covalently linked to the target substrate at the proximal end, and
   wherein the functional group allows the immobilizing of the layer or pattern of metal on the layer of polymeric material.

2. The method according to claim 1, wherein the layer of polymeric material is immobilized on the target substrate by covalently linking the polymeric material on the target substrate.

3. The method according to claim 1, wherein an adhesion between the stamp and the layer or pattern of metal is smaller than an adhesion between the layer of polymeric material and the layer or pattern of metal.

4. The method according to claim 1, wherein the layer of polymeric material has a contact angle of water in the range of 20° to 70°.

5. The method according to claim 1, wherein the layer of polymeric material has a Young's modulus in the range of 0.001 GPa to 5 GPa.

6. The method according to claim 1, wherein the layer of polymeric material when immobilized on the target substrate has an average thickness in the range of 1 nm to 20 μm.

7. The method according to claim 1, wherein the polymer is covalently linked to the target substrate via functional groups on the surface of the target substrate, the functional groups on the surface of the target substrate being selected from amino groups, hydroxyl groups, silanol groups, vinyl groups, carboxyl groups and thiol groups.

8. The method according to claim 7, wherein the polymer is covalently linked to the target substrate via functional groups on the proximal end of the polymer, the functional groups on the proximal end of the polymer being selected from amino groups, hydroxyl groups, silanol groups, alkoxy groups, vinyl groups, carboxyl groups, thiol groups and succinimide ester groups.

9. The method according to claim 8, wherein the functional group at the distal end of the polymer is selected from a thiol group, an amino group, a hydroxyl group, a carboxyl group, a nitrile group and a carbonyl group.

10. The method according to claim 9, wherein the poly(ethylene glycol) has a molecular weight in the range of 500 Da to 10000 Da.

11. The method according to claim 1, wherein the target substrate is made of a material selected from Si, Si having a $SiO_2$ layer on top of it, mica, glass, float glass, perovskites, quartz, amorphous composites, metal, metal oxide and a semiconductor, the metal being selected from the group comprising Au, Ti, Pt, Ag, Cr, Cu, Al, and alloys thereof, the metal oxide being selected from the group comprising $Al_2O_3$, AgO, $TiO_2$, $SiO_2$, $DyScO_3$, YsZ.

12. The method according to claim 1, wherein prior to immobilizing the layer of polymeric material on the target substrate, the target substrate includes a structure of metal of defined dimensions, such as height, target substrate area covered by the structure, length, and shape.

13. The method according to claim 12, wherein the structure of metal is at least partially integrated into a surface of the target substrate.

14. The method according to claim 13, wherein the layer of polymeric material has a height which is ≦40% higher than the height of the structure of metal above the surface of the target substrate.

15. The method according to claim 13, wherein the structure of metal is covered by a layer of molecules.

16. The method according to claim 15, wherein the layer of polymeric material has a height equal to a combined height of the structure of metal and the layer of molecules.

17. The method according to claim 9, wherein the poly(ethylene glycol) has a succinimide ester group on the proximal end and is covalently linked to the target substrate via amino groups on the surface of the target substrate which amino groups are linked with the succinimide ester group on the proximal end of the poly(ethylene glycol).

18. The method according to claim 9, wherein the poly(ethylene glycol) has a thiol group on the distal end.

19. The method according to claim 18, wherein the functional group at the distal end of the polymer is protected by a protecting group.

20. The method according to claim 19, wherein, after immobilizing a layer of polymeric material on the target substrate and prior to applying and immobilizing a layer or pattern of metal on the layer of polymeric material on the target substrate, the functional group at the distal end of the polymer is deprotected.

21. The method according to claim 1, wherein the layer or pattern of metal which has previously been applied onto the stamp, is transferred onto the layer of polymeric material on the target substrate upon bringing the stamp into conformal contact with the target substrate.

22. The method according to claim 16, wherein the metal in the layer or pattern of metal is selected from the group comprising Au, Ti, Pt, Ag, Cr, Cu, Al and alloys thereof, and the metal in the structure of metal is independently selected from the group comprising Au, Ti, Pt, Ag, Cr, Cu, Al and alloys thereof.

23. The method according to claim 1, wherein the stamp onto which a layer or pattern of metal has previously been applied is a polymeric stamp.

24. The method according to claim 23, wherein the polymeric stamp is made of a polymeric material selected from the group comprising elastomers, plastomers, ionomers and resins.

25. The method according to claim 4, wherein the layer of polymeric material has a contact angle of water in the range of 20° to 50°.

26. The method according to claim 25, wherein the layer of polymeric material has a contact angle of water in the range of 30° to 50°.

27. The method according to claim 5, wherein the layer of polymeric material has a Young's modulus in the range of 0.1 GPa to 0.5 GPa.

28. The method according to claim 1, wherein the layer of polymeric material when immobilized on the target substrate has an average thickness in the range of 1 nm to 200 nm.

29. The method according to claim 28, wherein the layer of polymeric material when immobilized on the target substrate has an average thickness in the range of 1 nm to 50 nm.

30. The method according to claim 29, wherein the layer of polymeric material when immobilized on the target substrate has an average thickness in the range of 1 nm to 10 nm.

31. The method according to claim 10, wherein poly(ethylene glycol) has a molecular weight in the range of 1000 Da to 5000 Da.

32. The method according to claim 31, wherein poly(ethylene glycol) has a molecular weight in the range of 2000 Da to 4000 Da.

33. The method according to claim 32, wherein poly(ethylene glycol) has a molecular weight of approximately 3000 Da.

34. The method according to claim 11, wherein the semiconductor is selected from the group comprising Si, Ge, GaAs, GaN, In, Sb, InP, CdS, ZnSe.

35. The method according to claim 14, wherein the height of the layer of polymetric material is ≦20% higher than the height of the structure of metal above the surface of the target substrate.

36. The method according to claim 35, wherein the height of the layer of polymetric material is ≦10% higher than the height of the structure of metal above the surface of the target substrate.

37. The method according to claim 19, wherein the functional group at the distal end of the polymer is the thiol group.

38. The method according to claim 19, wherein the protecting group is a trityl group.

39. The method according to claim 20, wherein the functional group at the distal end of the polymer is a thiol group.

40. The method according to claim 13, wherein the layer of polymeric material has a height equal to the height of the structure of metal above the surface of the target substrate.

* * * * *